(12) United States Patent
Baiocchi et al.

(10) Patent No.: US 6,987,052 B2
(45) Date of Patent: Jan. 17, 2006

(54) METHOD FOR MAKING ENHANCED SUBSTRATE CONTACT FOR A SEMICONDUCTOR DEVICE

(75) Inventors: Frank A. Baiocchi, Allentown, PA (US); John Charles Desko, Wescosville, PA (US); Bailey R. Jones, Mohnton, PA (US); Sean Lian, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 18 days.

(21) Appl. No.: 10/697,757

(22) Filed: Oct. 30, 2003

(65) Prior Publication Data

US 2005/0093097 A1    May 5, 2005

(51) Int. Cl.
*H01L 21/331* (2006.01)
(52) U.S. Cl. ...................... 438/343; 438/307
(58) Field of Classification Search ............. 438/343, 438/307, 308, 197, 306
See application file for complete search history.

(56) References Cited

U.S. PATENT DOCUMENTS

| 5,856,700 | A  | * | 1/1999  | Woodbury ............... 257/518 |
| 6,333,234 | B1 | * | 12/2001 | Liu ........................ 438/307 |
| 6,482,714 | B1 | * | 11/2002 | Hieda et al. .............. 438/416 |
| 6,828,628 | B2 | * | 12/2004 | Hergenrother et al. ...... 257/335 |

* cited by examiner

*Primary Examiner*—David Nelms
*Assistant Examiner*—Thinh T Nguyen

(57) ABSTRACT

A method of forming a semiconductor structure in a semiconductor wafer includes the steps of forming an epitaxial layer on at least a portion of a semiconductor substrate of a first conductivity type and forming at least one trench through the epitaxial layer to at least partially expose the substrate. The method further includes doping at least one or more sidewalls of the at least one trench with an impurity of a known concentration level. The at least one trench is then substantially filled with a filler material. In this manner, a low-resistance electrical path is formed between an upper surface of the epitaxial layer and the substrate.

16 Claims, 3 Drawing Sheets

METHOD FOR MAKING ENHANCED SUBSTRATE CONTACT FOR A SEMICONDUCTOR DEVICE

FIELD OF THE INVENTION

The present invention relates generally to semiconductor devices, and more particularly relates to techniques for forming an improved substrate contact for use in a metal-oxide-semiconductor device.

BACKGROUND OF THE INVENTION

Power MOS devices, including lateral diffused MOS (LDMOS) devices, are employed in a variety of applications, such as, for example, power amplifiers in wireless communications systems. Radio frequency (RF) LDMOS devices are generally fabricated on a semiconductor wafer comprising a substrate that is typically formed of single crystal silicon which has been heavily doped with an impurity, such as, for example, boron, so as to form a low-resistivity substrate (e.g., about $10^{18}$ to about $10^{19}$ atoms per cubic centimeter). A lightly doped epitaxial layer (e.g., about $10^{14}$ to about $10^{15}$ atoms per cubic centimeter), typically about ten microns thick, is generally formed on the substrate.

One problem in fabricating the LDMOS device is providing a low-resistance electrical path from the device formed near an upper surface of the wafer, through the lightly-doped epitaxial layer to the more heavily-doped substrate below. Previous attempts to solve this problem typically involve forming a diffused sinker by doping the surface of the silicon with a heavy boron predeposition or implanting a relatively high dose ion implant, which is then driven at a high temperature (e.g., in excess of 1000 degrees Celsius) for a long duration (e.g., typically in excess of about 10 hours) through the epitaxial layer and down to the substrate. In driving the diffusion or implant down into the silicon, however, the dopant will out-diffuse on either side by a certain amount, typically about 8 microns. Thus, the formation of the diffused sinker consumes a substantially large area in the wafer. The requirement of a high-dose implant step can also result in excessive implant time for the wafer as well as unacceptable wafer heating.

The long period of time required for the high temperature drive-in process can undesirably result in a large up-diffusion of dopant from the heavily-doped substrate into the lightly-doped epitaxial layer which effectively thins the epitaxial layer, thereby lowering the junction breakdown voltage and increasing junction leakage. Additionally, an increase in the number of misfit dislocations can occur, generally originating from mismatches between the lattices of the epitaxial layer and substrate, from the epitaxial layer/substrate interface to the surface of the epitaxial layer. This often leads to reliability problems, among other disadvantages.

Other known attempts at providing a low-resistance path between the upper surface of the wafer and the substrate below have involved forming one or more conductive plugs in the epitaxial layer down to the substrate. This methodology involves first forming trenches (e.g., by a dry etching process) or v-grooves (e.g., by a wet etching process) through the epitaxial layer down to the substrate and depositing a conductive material, such as, for example, tungsten, metal or silicide, in the trenches or v-grooves, thereby establishing an electrical connection with the substrate. A primary disadvantage of this approach, however, is the inability to control a surface doping in the substrate and source silicon to produce acceptable contact resistance between the substrate/source silicon and deposited conductive layer. Another disadvantage with this approach is the need to precisely control the fill of the trench so as to ensure a substantially planar surface, which is essential for further processing, and a substantially void-free fill, typically a requirement in forming a sufficiently low-resistance contact.

There exists a need, therefore, for an enhanced substrate contact capable of improved performance and reliability that does not suffer from one or more of the above-noted deficiencies typically affecting conventional substrate contacts. Furthermore, it would be desirable if such a substrate contact was fully compatible with a conventional semiconductor process technology.

SUMMARY OF THE INVENTION

The present invention provides techniques for forming an improved low-resistance (e.g., less than about 10 ohms per square) substrate contact for use, for instance, in an MOS device. The improved substrate contact may be formed, in accordance with an illustrative embodiment of the invention, by heavily doping the sidewalls of one or more deep trenches, formed through an epitaxial layer of a semiconductor wafer, with an impurity predeposition, such as, for example, using boron, phosphorous or arsenic. In this manner, a low-resistance path can be formed between an upper surface of the semiconductor wafer and the substrate, without the need for an extensive high-temperature drive-in process and without relying on filling the trenches with a conductive material (e.g., metal, silicide, etc.) having a significant contact resistance associated therewith.

In accordance with one aspect of the invention, a method of forming a semiconductor structure in a semiconductor wafer includes the steps of forming an epitaxial layer on at least a portion of a semiconductor substrate of a first conductivity type and forming at least one trench through the epitaxial layer to at least partially expose the substrate. The method further includes doping at least one or more sidewalls of the at least one trench with an impurity of a known concentration level. The at least one trench is then substantially filled with a filler material. In this manner, a low-resistance electrical path is formed between an upper surface of the epitaxial layer and the substrate.

These and other features and advantages of the present invention will become apparent from the following detailed description of illustrative embodiments thereof, which is to be read in connection with the accompanying drawings.

DETAILED DESCRIPTION OF THE PREFERRED EMBODIMENTS

The present invention will be described herein in the context of an illustrative MOS integrated circuit fabrication technology suitable for forming discrete RF LDMOS transistors, as well as other devices and/or circuits. It should be appreciated, however, that the present invention is not limited to the fabrication of this or any particular device or circuit. Rather, the invention is more generally applicable to techniques for forming a semiconductor structure capable of providing a low-resistance electrical connection between an upper surface of an epitaxial layer and a substrate associated with a semiconductor wafer. Moreover, although implementations of the present invention are described herein with specific reference to an LDMOS device and a complementary metal-oxide-semiconductor (CMOS) fabrication process, it is to be appreciated that the techniques of the present invention are similarly applicable to other fabrication processes (e.g., bipolar) and/or the formation of other devices, such as, but not limited to, an MOS field-effect transistor (MOSFET), a bipolar junction transistor (BJT), a vertical diffused MOS (DMOS) device, an extended drain MOSFET device, etc., with or without modifications thereto, as will be understood by those skilled in the art. Other semiconductor devices, such as, but not limited to, monolithic capacitors, resistors, etc., may also benefit from the techniques of the present invention set forth herein.

FIGS. 1–7 depict steps in an exemplary methodology which may be used in forming an improved substrate connection which may be used, for example, in an MOS device, in accordance with an illustrative embodiment of the present invention. The exemplary methodology will be described in the context of a conventional CMOS-compatible semiconductor fabrication process technology. It is to be appreciated that the invention is not limited to this or any particular methodology for fabricating the device. Moreover, it is to be understood that the various layers and/or regions shown in the accompanying figures may not be drawn to scale, and that one or more semiconductor layers of a type commonly used in such integrated circuit structures may not be explicitly shown in a given figure for ease of explanation. This does not imply that the semiconductor layer(s) not explicitly shown are omitted in the actual integrated circuit structure.

Figure 1:
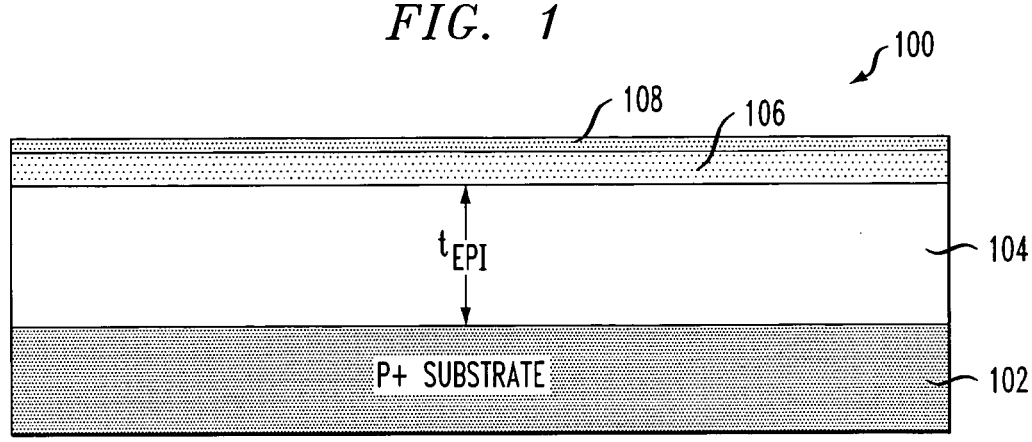
FIGS. 1–7 are cross-sectional views depicting steps in a semiconductor fabrication process which may be used in forming an exemplary substrate contact, in accordance with an illustrative embodiment of the present invention.

FIG. 1 illustrates a cross-sectional view of at least a portion of a semiconductor wafer 100. The wafer 100 includes a substrate 102, which is commonly formed of single-crystal silicon (e.g., having a <100> or <111> crystal orientation), although alternative materials may be used, such as, but not limited to, germanium (Ge), gallium arsenide (GaAs), etc. Additionally, the substrate may have been modified by adding an impurity or dopant to change the conductivity of the material (e.g., n-type or p-type). In a preferred embodiment of the invention, the substrate 102 is of p-type conductivity and may thus be referred to as a p+ substrate. A p+ substrate may be formed, for example, by adding a p-type impurity or dopant (e.g., boron) of a desired concentration (e.g., about $5 \times 10^{18}$ to about $5 \times 10^{19}$ atoms) to the substrate material as it is grown, or by a diffusion or implant step after the substrate is grown, to change the conductivity of the material as desired.

The wafer 100 may include an epitaxial layer 104 formed on at least a portion of the substrate 102. The epitaxial layer 104 is preferably grown over the entire surface of the wafer 100, such as, for example, by using a conventional epitaxy process. Epitaxy is a well-known deposition technique during which additional silicon atoms can be deposited on a single-crystal silicon substrate, without changing the crystalline structure of the silicon wafer. During the epitaxial deposition, the single-crystal silicon substrate 102 can be extended by, for example, a vapor deposition of additional atomic layers of silicon. By controlling the deposition rates, and introducing selected types of impurities (e.g., boron, phosphorous, arsenic, etc.) into the carrier gases, the thickness and resistivity of the epitaxial layer 104 can be precisely controlled as desired. The thickness, $t_{EPI}$, of the epitaxial layer 104 is typically about 6 to 10 microns. In a preferred embodiment of the invention, the epitaxial layer 104 is lightly doped compared to the substrate, e.g., about $5 \times 10^{14}$ to about $10^{15}$ atoms percubic centimeter, with a p-type impurity (e.g., boron).

The term "semiconductor wafer," or simply "wafer," as may be used herein refers to the substrate 102, with or without an epitaxial layer 104, and preferably includes one or more other layers formed on the substrate. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on which a semiconductor structure may be formed.

As apparent from the figure, one or more insulating layers may be formed on at least a portion of the epitaxial layer 104. The insulating layers preferably comprise an oxide, such as, for example, silicon dioxide ($SiO_2$) and may therefore be referred to as oxide layers. The insulating layers may comprise alternative materials, such as, but not limited to, silicon nitride (SiN), etc. A first oxide layer 106 is preferably grown on the epitaxial layer 104, such as by using an oxidation (e.g., local oxidation) or surface passivation process. Oxidation, or surface passivation, may be achieved by exposing an upper surface of the silicon wafer 100 to an oxidizing agent, such as, but not limited to, oxygen gas, water vapor, etc., at a relatively high temperature (e.g., about 900 to about 1200 degrees Celsius). The first oxide layer 106 may be referred to as a thermal oxide layer. A second oxide (or nitride) layer 108 may be formed on at least a portion of the thermal oxide layer 106, such as, for example, by using low-pressure chemical vapor deposition (LPCVD), or an alternative deposition process. In a preferred embodiment of the invention, the second oxide layer 108 comprises low-pressure tetraethyloxysilane (LP-TEOS), and may therefore be referred to herein as a TEOS layer. The oxide layer(s) 106, 108, each of which may be about 0.5 microns thick for a 0.35-micron CMOS process, provide many benefits during the fabrication of an MOS device, some of which include protecting the wafer from external contamination and serving as a barrier to the diffusion of impurities into the silicon. Thus, by etching well-defined patterns in the oxide layer(s), one can accurately diffuse desired impurities into selected areas of the wafer 100.

Figure 2:
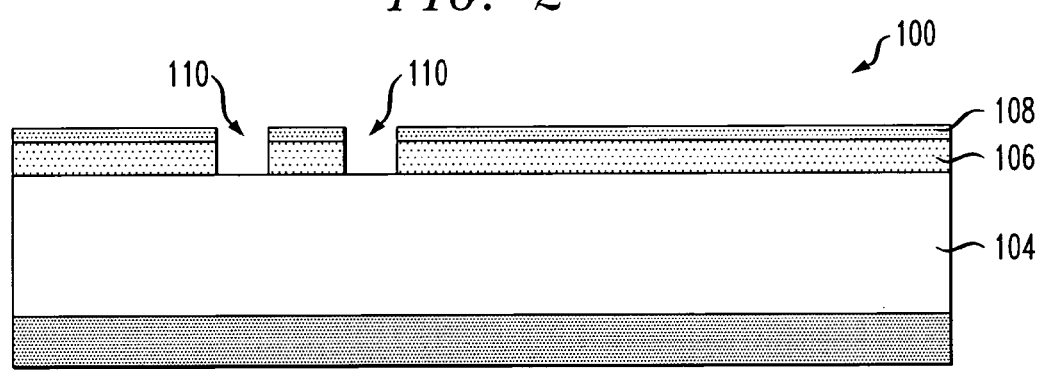

FIG. 2 illustrates the formation of one or more openings 110 through the TEOS layer 108 and thermal oxide layer 106, to at least partially expose the epitaxial layer 104. The openings 110 may be formed by selectively patterning the TEOS layer 108, for example, using a conventional photolithographic process, followed by an etching step. During the photolithographic patterning process, a layer of photoresist (not shown) is first deposited on the upper surface of the wafer 100 to prevent the oxide layers 106, 108 from being removed in a subsequent etching process. The photoresist is then exposed to light (e.g., ultra violet) in a manner which allows the photoresist to be removed in areas of the wafer in which the openings 110 are to be formed. During the etching process, which may comprise, for example, an anisotropic dry etch, the oxide layers 106, 108 are removed down to the epitaxial layer 104. It is to be understood that alternative etching techniques may be similarly employed for forming the openings 110, such as, but not limited to, reactive ion etching (RIE), wet etching, etc. In a preferred embodiment of the invention, the openings 110 are about one to two microns, and more preferably about 1.2 microns, in width and spaced about 5 microns apart relative to one another, for an exemplary 0.35-micron CMOS process.

Figure 3:
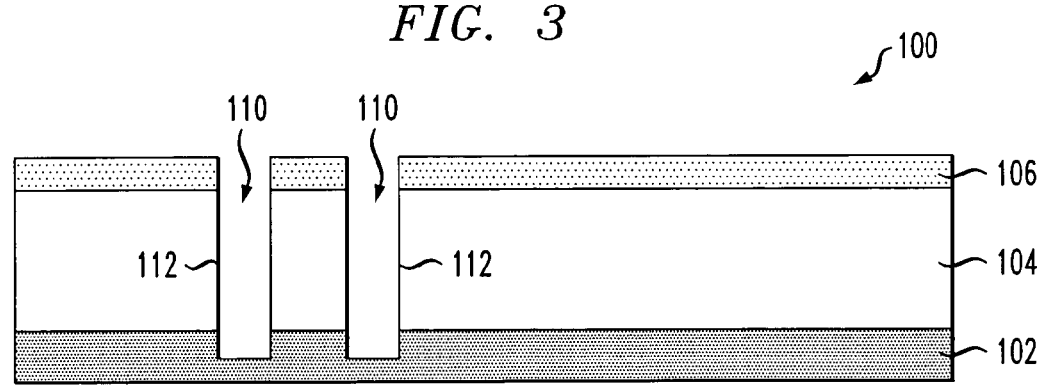

FIG. 3 illustrates the formation of one or more deep trenches 112 through the openings 110 formed in the thermal oxide layer 106. The trenches 112 are preferably formed by first stripping the photoresist (not shown) from the upper surface of the wafer 100, such as by using a wet etching process (e.g., using a mixture of sulfuric acid and hydrogen peroxide), and then etching (e.g., dry etching, RIE, etc.) through the epitaxial layer 104 to at least partially expose the substrate 102. The present invention contemplates that the openings 110 through the epitaxial layer 104 may be formed using alternative methodologies, such as, for example, a conventional v-groove technique. As is known by those skilled in the art, a v-groove may be formed using a wet etching process (e.g., potassium hydroxide (KOH) based etch). A v-groove, as the name implies, is typically characterized by sidewalls that are v-shaped (e.g., sloped), and thus significantly less steep compared to the sidewalls of trenches 112. Since the distance that must be etched through the epitaxial layer may be significant (e.g., about 10 or more microns), the slope of the sidewalls associated with the v-groove would require the opening of the v-groove proximate the upper surface of the wafer 100 to be substantially wide, which may be undesirable in forming structures where density is a premium. Therefore, while alternative methodologies may be used to form the trenches 112, using a dry etch to form the trenches is preferable.

Figure 4:
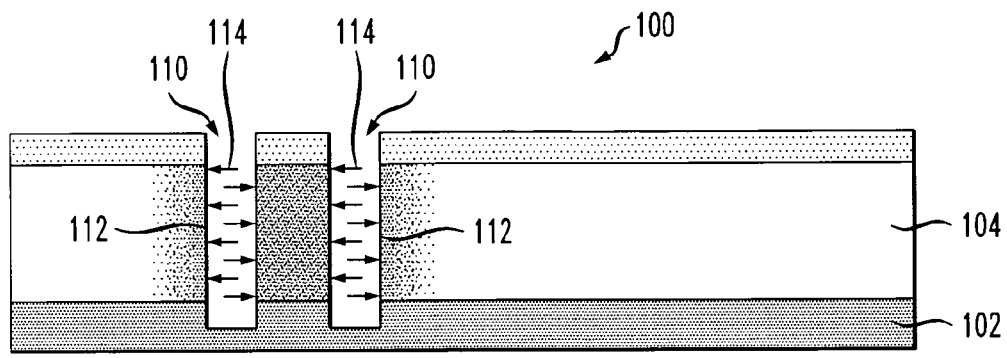

As shown in FIG. 4, after forming the trenches 112 through the epitaxial layer 104, a cleaning step is preferably performed to expose the silicon by substantially removing any organic material remaining in the trenches. The cleaning step may be performed, for example, using a wet etch (e.g., hydrofluoric (HF) acid, etc.), as will be known by those skilled in the art. At least the sidewalls of the trenches 112 are then heavily doped with an impurity 114, such as, but not limited to, boron. In an alternative embodiment of the invention, less than all sidewalls, or a sidewall and bottom wall, of the trenches may be doped. The doping of the trenches 112 may be performed by predepositing the impurity 114 (e.g., boron) on at least one or more sidewalls of the trenches, and then performing a drive-in process for diffusing the impurity 114 deeper into the epitaxial layer 104 to obtain a desired low-resistance path. The drive-in step may comprise, for example, heating the wafer 100 at a relatively high temperature, such as about 900 to 1200 degrees Celsius, for a relatively short duration, such as about one hour.

An important advantage of the techniques of the present invention is the elimination of the long duration high-temperature drive-in process required by conventional methodologies, thereby improving the performance and reliability of the device formed in the wafer 100, as well as significantly speeding up the fabrication process. As previously explained, in forming a conventional substrate contact comprising a diffused sinker, in order to distribute the impurity, which is typically diffused or implanted near the upper surface of the wafer, through the epitaxial layer and down to the substrate, an extensive high-temperature drive-in process is undesirably required. The duration of time required is generally proportional to the thickness of the epitaxial layer, since the rate of diffusion of the impurity is relatively constant for a given temperature and impurity type.

Forming openings 110 in the epitaxial layer 104 down to the substrate 102 advantageously enables the impurity 114 to be deposited, through the sidewalls of the trenches 112, in a substantially distributed manner between the upper surface of the epitaxial layer and the substrate. The deposition of the impurity 114 can be accomplished, for instance, by growing an impurity-rich oxide on the sidewalls of the trenches 112. Alternatively, the deposition may be accomplished using an implant step, especially where the sidewalls of the trenches are at least slightly sloped (e.g., v-shaped). Depositing the impurity 114 through the sidewalls of the trenches 112 enables the impurity to be placed in closer proximity to the substrate. Consequently, a significantly shorter drive-in process is needed, as compared to traditional approaches, in order to distribute the impurity through the epitaxial layer 104 as desired. The shorter drive-in period of the present invention beneficially decreases the likelihood that misfit dislocations from the epitaxial layer/substrate interface will diffuse to the surface of the epitaxial layer, thereby reducing device electrical leakage and reliability problems.

Figure 5:
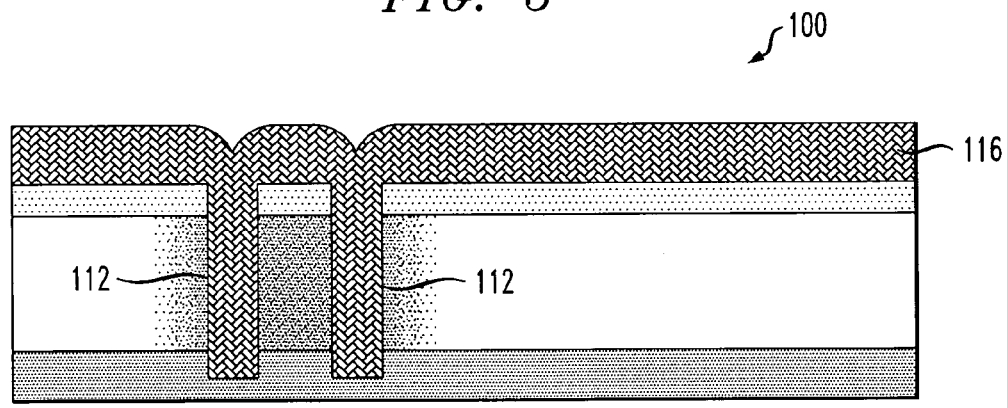

FIG. 5 illustrates a trench fill process. After the impurity predeposition and drive-in steps, a wet chemical clean-up, or alternative wafer cleaning process, is preferably performed in order to substantially remove any surface contaminants that may remain in the trenches 112. The clean-up process may comprise, for example, placing the wafer 100 in a 1:1 solution of hydrogen peroxide and sulphuric acid for about 15 minutes. The wafer may also be dipped in a dilute solution of HF to strip away any oxide in the trenches, exposing the silicon in the epitaxial layer 104 and substrate 102 proximate the sidewalls of the trenches 112.

After the clean-up step, the trenches 112 are preferably filled with a filler material 116, such as, for instance, polysilicon. The polysilicon can be deposited using, for example, a LPCVD process, although alternative deposition techniques may also be employed, as will be known by those skilled in the art. The filler material 116 primarily provides planarization and structural support for the trenches 112 and thus need not have a substantially low resistivity associated therewith. Unlike a traditional conductive plug, which relies on the filler material being of low resistivity in order to provide the low-resistance electrical path between the upper surface of the wafer and the substrate, the substrate contact of the present invention relies on the doped sidewalls of the trenches 112 to provide the low-resistance electrical path. However, use of a filler material having a low resistivity (e.g., CVD tungsten, silicide, doped polysilicon, etc.) may even further lower the resistance of the substrate contact. In a preferred embodiment of the invention, doped polysilicon is used as the filler material 116. Since polysilicon characteristically behaves in a manner similar to silicon, the use of polysilicon as a filler material for the trenches provides a more homogeneous upper surface of the wafer 100, thereby making it easier to form active devices in the upper surface of the wafer, and is thus preferred.

Figure 6:
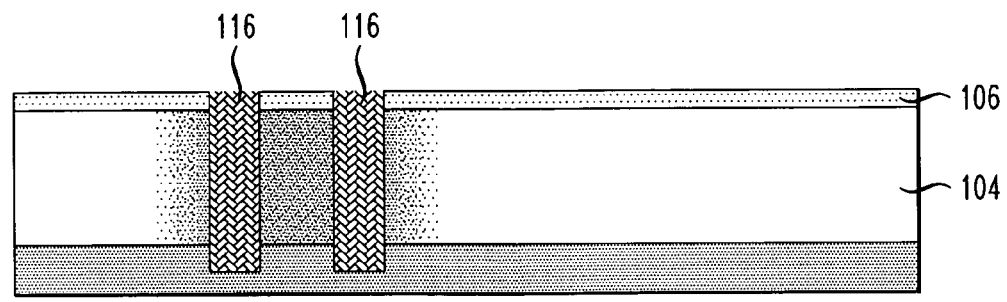

In FIG. 6, a wafer planarization step is depicted, wherein the upper surface of the wafer 100 is made substantially planar. To accomplish this, an upper surface of the filler material 116 is removed down to the thermal oxide layer 106 using a process, such as, but not limited to, chemical-mechanical polishing (CMP), plasma etch-back, etc., although alternative means (e.g., wet etching, etc.) are similarly contemplated by the invention. The thermal oxide layer 106 is preferably used as a stop so that the epitaxial layer 104 is not damaged during the planarization process.

Figure 7:
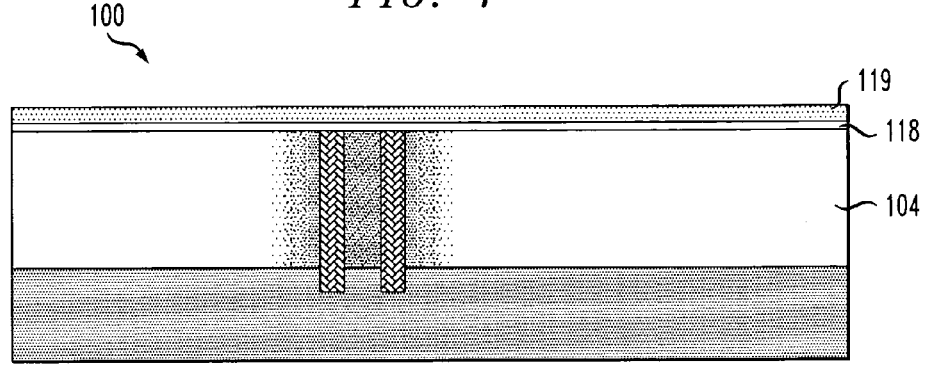

Once the upper surface of the wafer has been made substantially planar, the thermal oxide layer 106 is preferably removed, such as by etching, and a thin oxide layer 118 and a silicon nitride layer 119 may be formed on the upper surface of the wafer 100, as shown in FIG. 7. These layers 118, 119 may be used in a subsequent gate and source and drain (GASAD) process in which a gate and source and drain regions are formed in the wafer 100, as used to fabricate MOS devices in the conventional manner.

Figure 8:
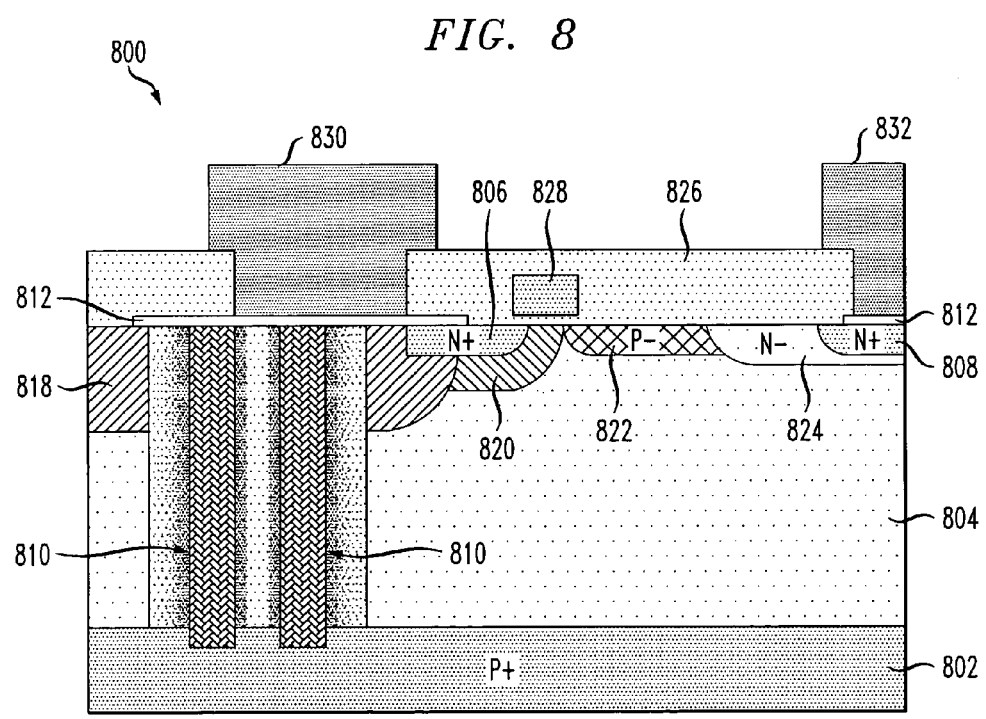
FIG. 8 is a cross-sectional view depicting at least a portion of an exemplary LDMOS device comprising the illustrative substrate contact formed by the semiconductor fabrication process shown in FIGS. 1–7, in accordance with another embodiment of the invention.

FIG. 8 illustrates a cross-sectional view of at least a portion of a semiconductor wafer 800 in which the techniques of the present invention are implemented. The wafer 800 includes an exemplary LDMOS device formed on a semiconductor wafer which comprises a p+ substrate 802 and an epitaxial layer 804. The exemplary LDMOS device includes a source region 806 and a drain region 808 formed in the epitaxial layer 804 of the wafer 800, such as by an implant or diffusion process. The source and drain regions are preferably doped, such as by an implant process, with an impurity (e.g., boron, phosphorus, etc.) of a known concentration level to selectively change the conductivity of the material as desired. Preferably, the source and drain regions 806, 808 have a conductivity type associated therewith which is opposite a conductivity type of the substrate 802, so that active regions can be formed in the device. In a preferred embodiment of the invention, the source and drain regions 806, 808 are of n-type conductivity.

A low-resistance (e.g., less than about 1 ohm per square) electrical path between the source region 806 and the substrate 802 is provided by forming one or more improved substrate contacts 810 through the epitaxial layer 804 of the wafer 800, such as in the manner previously described in connection with FIGS. 1–7. The substrate contacts 810 are preferably electrically connected to the source region 806 by forming a conductive layer 812 on an upper surface of the epitaxial layer 804. The conductive layer 812 preferably comprises a silicide layer, such as titanium silicide, deposited by a sputter deposition process, although alternative conductive materials and/or deposition methodologies may be similarly employed, as will be known by those skilled in the art.

It is to be appreciated that, in the case of forming a simple MOS device, because the MOS device is symmetrical in nature, and thus bidirectional, the assignment of source and drain designations in the MOS device is essentially arbitrary. Therefore, the source and drain regions may be referred to generally as first and second source/drain regions, respectively, where "source/drain" in this context denotes a source region or a drain region. In an LDMOS device, which is generally not bidirectional, such source and drain designations may not be arbitrarily assigned.

The exemplary LDMOS device may include a body region 818 formed in the epitaxial layer 804, such as by a conventional implant and diffusion process. The body region 818 is preferably formed adjacent to the source region 806 and extends laterally in a direction opposite the drain region 808. The body region 818 is preferably doped, such as by a conventional implant step, with an impurity of a known concentration level to selectively change the conductivity of the material as desired. Preferably, the body region 818 has a conductivity type associated therewith which is opposite a conductivity type of the source region 806. In a preferred embodiment of the invention, the body region 818 is of p-type conductivity, and is therefore referred to as a p-body.

A channel region 820 and a drift region, which may comprise a first LDD region 822 and a second LDD region 824, is formed proximate an upper surface of the exemplary LDMOS device, just beneath an interface between the silicon epitaxial layer 804 and an insulating layer 826, which in a preferred embodiment is formed of an oxide (e.g., silicon dioxide ($SiO_2$), etc.). This interface may thus be referred to as a silicon/oxide interface. The channel region 820 is formed at least partially below and adjacent to the source region 806 while the drift region extends laterally between the channel region 820 and the drain region 808 in the LDMOS device. The channel region 820 may be formed of a material having the same conductivity type as the substrate, preferably p-type in the exemplary device, and may therefore be referred to as a p-channel.

The exemplary LDMOS device further includes a gate 828 formed above at least a portion of the channel region 820 and proximate the silicon/oxide interface of the wafer 800. The gate 828 may be formed of, for example, polysilicon material, although alternative suitable materials (e.g., metal, etc.) may be similarly employed.

A source contact 830 and a drain contact 832 may be formed on an upper surface of the insulating layer 826, such as, for example, by forming openings in the insulating layer (e.g., by photolithographic patterning and etching) to expose the silicide layer 812 and drain region 808, respectively, and filling the openings with an electrically conductive material (e.g., aluminum, gold, etc.), as will be understood by those skilled in the art. The silicide layer 812 facilitates electrical connection with the source region 808, since it would otherwise be difficult to form a metal layer directly on the silicon source region 806. Connection to the source region 806 may also be made through a bottom surface of the substrate, since the substrate contacts 810 provide a substantially low-resistance electrical path between the source region 806 and the substrate 802, as previously explained. A gate contact (not shown) may also be formed on the upper surface of the insulating layer 826, or in an alternative location, for providing an electrical connection to the gate 828.

It is to be appreciated that although the exemplary substrate contact shown in the accompanying figures includes two trenches, the number and/or geometrical dimensions and shapes of the trenches are not limited in any way to the precise embodiment shown. Rather, the present invention contemplates that any number, shape and/or size of the trenches may be used to form the substrate contact. For instance, the substrate contact may comprise a single trench, or more than two trenches. Moreover, although all of the sidewalls and bottom wall of the trenches are preferably heavily doped, this is not a requirement of the invention. For example, only one sidewall, or a sidewall and bottom wall may be doped, so as to provide a sufficient distribution of impurity between the substrate and upper surface of the wafer.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method of forming a semiconductor structure in a semiconductor wafer, the method comprising the steps of:

forming an epitaxial layer on a least a portion of a semiconductor substrate of a first conductivity type;

forming at least one trench through the epitaxial layer to at least partially expose the substrate;

doping at least one or more sidewalls of the at least one trench with an impurity of a known concentration level so as to form a low-resistance electrical path between an upper surface of the epitaxial layer and the substrate; and substantially filling the at least one trench with a filler material;

wherein the step of doping at least one or more sidewalls of the at least one trench with an impurity comprises:

cleaning the sidewalls of the at least one trench to substantially remove any organic material in the at least one trench;

predepositing the impurity on at least one or more sidewalls of the at least one trench; and driving in the impurity.

2. The method of claim 1, further comprising the steps of:

polishing the upper surface of the epitaxial layer so that the upper surface of the epitaxial layer is substantially planar; and forming an insulating layer on at least a portion of the upper surface of the semiconductor wafer.

3. The method of claim 1, wherein the step of forming the at least one trench comprises:

forming an insulating layer on at least a portion of the epitaxial layer;

forming at least one opening in the insulating layer corresponding to the at least trench; and etching through the epitaxial layer to at least partially expose the substrate.

4. The method of claim 1, wherein the at least one trench comprises a v-groove.

5. The method of claim 1, wherein the impurity comprises boron.

6. The method of claim 1, wherein the step of driving in the impurity comprises heating the semiconductor wafer for a predetermined period of time.

7. The method of claim 6, wherein the step of heating the semiconductor wafer comprises heating the semiconductor wafer at a temperature in a range of about 900 degrees Celsius to about 1200 degrees Celsius for a duration of about one hour.

8. The method of claim 1, wherein the step of predepositing the impurity on at least one or more sidewalls of the at least one trench comprises growing an impurity-rich oxide on at least one or more sidewalls of the at least one trench.

9. The method of claim 1, wherein the step of substantially filling the at least one trench comprises depositing a semiconductor material in the at least one trench so as to substantially fill the trench.

10. The method of claim 1, wherein the filler material comprises polysilicon material.

11. The method of claim 1, further comprising the step of forming at least one insulating layer on at least a portion of the epitaxial layer.

12. The method of claim 1, further comprising the step of:

forming an active device in the epitaxial layer proximate the upper surface of the epitaxial layer, the active device being in electrical connection with a first end of the at least one trench, a second end of the at least one trench being electrically connected to the substrate.

13. The method of claim 12, wherein the active device comprises a metal-oxide-semiconductor device.

14. The method of claim 1, further comprising the steps of:

forming an insulating layer on at least a portion of the upper surface of the epitaxial layer;

forming a gate on at least a portion of the insulating layer;

forming first and second source/drain regions of a second conductivity type in the epitaxial layer proximate the upper surface of the epitaxial layer, the first source/drain region being spaced laterally from the second source/drain region, the gate being formed at least partially between the first and second source/drain regions, the first source/drain region being electrically connected to a first end of the at least one trench and a second end of the at least one trench being electrically connected to the substrate.

15. The method of claim 1, wherein the step of forming at least one trench comprises forming at least two trenches through the epitaxial layer to at least partially expose the substrate, the at least two trenches being spaced about five microns apart relative to one another.

16. The method of claim 1, wherein the at least one trench is formed about one to two microns in width.

* * * * *